US009227846B2

(12) United States Patent
Peng et al.

(10) Patent No.: US 9,227,846 B2
(45) Date of Patent: Jan. 5, 2016

(54) PURIFICATION OF NANOCRYSTALS FOR THERMOELECTRIC, SOLAR, AND ELECTRONIC APPLICATIONS

(71) Applicant: Evident Technologies, Troy, NY (US)

(72) Inventors: Adam Z. Peng, Schenectady, NY (US); Gregg Bosak, Hoosick Falls, NY (US); Clinton T. Ballinger, Burnt Hills, NY (US); Katie Fiske, Petersburgh, NY (US); Susanthri Perera, Cohoes, NY (US)

(73) Assignee: Evident Technologies, Inc., Troy, NY (US)

( * ) Notice: Subject to any disclaimer, the term of this patent is extended or adjusted under 35 U.S.C. 154(b) by 129 days.

(21) Appl. No.: 14/189,141

(22) Filed: Feb. 25, 2014

(65) Prior Publication Data

US 2014/0241977 A1 Aug. 28, 2014

Related U.S. Application Data

(60) Provisional application No. 61/768,737, filed on Feb. 25, 2013.

(51) Int. Cl.

| | |
|---|---|
| ***H01L 21/00*** | (2006.01) |
| ***C01B 19/04*** | (2006.01) |
| ***C01B 19/00*** | (2006.01) |
| ***H01L 35/16*** | (2006.01) |

(52) U.S. Cl.

CPC ............... *C01B 19/04* (2013.01); *C01B 19/002* (2013.01); *H01L 35/16* (2013.01); *C01P 2002/50* (2013.01); *C01P 2004/64* (2013.01)

(58) Field of Classification Search

None

See application file for complete search history.

(56) References Cited

U.S. PATENT DOCUMENTS

| | | | | |
|---|---|---|---|---|
| 8,728,434 | B2 * | 5/2014 | Ballinger et al. | 423/508 |
| 2011/0059467 | A1 * | 3/2011 | Ting et al. | 435/7.21 |

* cited by examiner

*Primary Examiner* — Seahvosh Nikmanesh

(74) *Attorney, Agent, or Firm* — Hoffman Warnick LLC

(57) ABSTRACT

Disclosed herein is a method of purifying and doping a population of semiconductor nanocrystals. The method includes mixing the population of semiconductor nanocrystals having a first material system and a first ligand with a set of particles in the presence of a first solvent, the set of particles having a second material system which is different from the first material system and a second ligand which is different from the first ligand, to form a mixture. The method also includes facilitating a ligand exchange and an ionic exchange in the mixture, altering the first material system of the population of semiconductor nanocrystals to a third material system, different from the first material system and the second material system. The method includes sonicating the mixture and isolating the population of semiconductor nanocrystals having the third material system and the second ligand from the mixture.

20 Claims, No Drawings

PURIFICATION OF NANOCRYSTALS FOR THERMOELECTRIC, SOLAR, AND ELECTRONIC APPLICATIONS

CROSS-REFERENCE TO RELATED APPLICATIONS

This application claims the benefit of co-pending U.S. Provisional Application Ser. No. 61/768,737, filed 25 Feb. 2013, which is hereby incorporated by reference herein.

FIELD OF THE INVENTION

Embodiments of the present invention relate generally to methods of purifying nanocrystals using sonication for ionic exchange and ligand exchange techniques to control stoichiometry and reduce contaminate levels in order to improve the characteristics of the material.

BACKGROUND OF THE INVENTION

Semiconductor materials have a broad range of applications including, but not limited to, transistors, diodes, sensors, solar cells, photovoltaic devices, and thermoelectric devices. Typically, these materials are synthesized utilizing epitaxial growth techniques. The resultant semiconductor materials are frequently used in such applications, forming the backbone of many modern electronic applications. These semiconductor materials are often processed. For instance, they may be shaped into a flat wafer. However, the processed material is typically rigid and fragile due to the crystal structure resulting from the epitaxial growth method.

Recent computation research focused on predicting the optimal material system for thermoelectric applications suggests that a material system that possesses a discrete density of electron states that are regularly spaced would be beneficial. However, creating these ideal nano-structures has presented numerous challenges; such as controlling stoichiometry, controlling particle sizes, and reduction of organic surface ligands. Also, previous attempts have struggled with creating a process that will result in a scalable method that can allow for control over the semiconductor particle on a larger scale than lab experiments.

Previous attempts have included creating $Bi_2S_3$ nanocrystals and performing a subsequent ionic exchange by mixing with excess $Sb_2Te_3$ to form $Bi_xSb_{(2-x)}Te_3$ nanocrystals. This method has resulted in residual organic surface ligands as well as difficult to control reaction kinetics, times, and concentrations. Additionally, the inability to reduce contaminate levels has proved a problem.

BRIEF DESCRIPTION OF THE INVENTION

A first embodiment of the invention includes a method of exchanging an ion in a population of semiconductor nanocrystals, the method comprising: mixing the population of semiconductor nanocrystals having a first material system with a set of particles in the presence of a first solvent, the set of particles having a second material system which is different from the first material system, to form a mixture; facilitating an ionic exchange in the mixture, altering the first material system to a third material system, different from the first material system and the second material system; sonicating the mixture; and isolating the population of semiconductor nanocrystals having the third material system from the mixture.

A second embodiment of the invention includes a method of exchanging a ligand in a population of semiconductor nanocrystals, the method comprising: mixing the population of semiconductor nanocrystals having a first ligand with a set of particles in the presence of a first solvent, the set of particles having a second ligand which is different from the first ligand, to form a mixture; facilitating a ligand exchange in the mixture; sonicating the mixture; and isolating the population of semiconductor nanocrystals having the second ligand from the mixture.

A third embodiment of the invention includes a method of purifying and doping a population of semiconductor nanocrystals, the method comprising: mixing the population of semiconductor nanocrystals having a first material system and a first ligand with a set of particles in the presence of a first solvent, the set of particles having a second material system which is different from the first material system and a second ligand which is different from the first ligand, to form a mixture; facilitating a ligand exchange and an ionic exchange in the mixture, altering the first material system of the population of semiconductor nanocrystals to a third material system, different from the first material system and the second material system; sonicating the mixture; and isolating the population of semiconductor nanocrystals having the third material system and the second ligand from the mixture.

DETAILED DESCRIPTION OF THE INVENTION

Embodiments of the present invention include a method which enables a reduction in contaminant levels and better control of the stoichiometry of semiconductor nanocrystals. According to some embodiments, nanocrystals are utilized that have been synthesized using a colloidal methodology, rather than the epitaxial growth of previous embodiments. This colloidal growth can allow for the same stoichiometry as epitaxially grown semiconductors, but offers more flexibility, as it is not grown on a rigid surface, further allowing separation of the growth and deposition steps for the material, which are inherently coupled in epitaxial approaches.

Following the colloidal synthesis, an ionic exchange and/or a ligand exchange may be facilitated in order to produce the final desired material. Facilitation can include sonication, as further described below, heating, use of a vacuum or pressure, or any combination of these techniques. In some embodiments, semiconductor nanocrystals are synthesized in organic solutions, often with long chain organic surface ligands. The long chain organic surface ligands can help control the reaction kinetics of the synthesis and keep the particles in solution. However, these long chain ligands, and organic molecules in general, may be undesirable in the final electronic material, as they can decrease the electrical conductivity of the resultant material. Accordingly, embodiments of the present invention include removing these organic ligands from the nanocrystals in order to purify the final product.

Complete removal of the organic surface ligands has proven very difficult, impeding the adoption of semiconductor nanocrystals for use in electronic applications. For instance, organic residue in electronic materials can greatly reduce their performance, and in some applications there may be little tolerance for any such contaminants. Traditionally, these organic surface ligands have proven extremely difficult to remove. However, according to embodiments of the present invention, a method is presented that allows for removal of the ligands and any residue. In addition, the disclosed method can allow for synthesis of one material system using colloidal chemistry, and subsequent alteration of the system stoichiometry via an ionic exchange according to certain embodiments. This ionic exchange step can be used 'dope' the nanocrystals, altering their final stoichiometry, i.e., changing the ratio of included atomic species to one another. In certain embodiments, the 'doping' of the ionic exchange can include replacing one atomic species with another species inside the already synthesized semiconductor nanocrystal, adding or removing certain atomic species to or from the nanocrystals, altering the ratio of already included atomic species, or any combination thereof.

In one embodiment, a population of colloidally synthesized semiconductor nanocrystals of a first material system, which may include organic ligands, can be mixed with particles of a second, different material system. By material system, the term is understood to include the types of and ratio of atomic species of the nanocrystals and particles, and may also include any ligands and/or solvent used as well. These particles of a second material system may include other nanocrystals, other nanoparticles, or simply molecules of the chosen second material system, which may or may not also be semiconductor materials. The particles may further include inorganic ligands around the particles. An ionic exchange, a ligand exchange, or both may be facilitated by any known or developed means, including heating, using pressure and/or a vacuum, and sonication. In some embodiments, his mixture may be sonicated, which can result in an ionic exchange, a ligand exchange, or both, depending on the two material systems and the ligands present. Sonication of the mixture can enhance the ionic exchange and the ligand exchange as compared to traditional methods of facilitating an exchange, and may also reduce levels of any unwanted species, or contaminants, in the solution. Sonication of the mixture may help 'refresh' the surface area of the reacting nanocrystals.

For instance, sonication may result in any nanoparticles that have started to conglomerate breaking apart and exposing more of the surface area of each nanoparticle. Refreshing the surface of the nanocrystals may also reduce any contaminants, such as long chain organic ligands attached to the nanocrystals or residual atoms left from the organic ligands or solvents, or any impurities that may have been in any of the starting materials, as the process of sonicating and exposing the nanocrystal surface can result in making more sites at the surface of the nanocrystals available for the organic ligands to be replaced by ligands from the second ligand, which may include an inorganic ligand. In addition, sonication of the mixture can liberate species that are to undergo ionic exchange, such an atomic species present in the population of semiconductor nanocrystals but not in the particle. Both the ion being replaced and the organic ligands may be considered unwanted contaminants, and the reduction of these may lead to better material performance in electronic applications such as solar cells, thermoelectric devices, and other electronic applications. Further, any impurities included in the mixture may be removed during the sonication, as well as any subsequent washing as described below.

In one example, colloidally synthesized $Bi_2S_3$ nanocrystals with organic ligands can be mixed with $Sb_2Te_3$ with inorganic ligands and undergo an ionic exchange and a surface ligand exchange to form $Bi_xSb_{(2-x)}Te_3$ with inorganic ligands. In order to enhance the ionic/ligand exchange and reduce levels of unwanted species (in this example, sulfur and the organic ligands would be such contaminants) the solution is sonicated to help refresh the surface area of the reacting nanoparticles. In the above example, both the sulfur and the organic ligands may be considered unwanted contaminants which the sonication can aid in removing.

In a further embodiment, two precursors, that once reacted will give the desired stoichiometry, undergo vigorous mixing. The reacting can include any reaction mechanisms, including stirring, heating, applying pressure, or other methods of facilitating a reaction, as well as combination thereof. Once mixed, the solution is sonicated, which breaks up the particles that may have aggregated and ultimately refreshes the surface of the resultant nanoparticles. Sonication can lead to more complete ionic exchanges and ligand exchanges, as well as helping control the size of the nanoparticles through the breaking up of aggregated particles.

In a further embodiment, during the sonication and ligand/ionic exchange steps the material may undergo at least one, and perhaps multiple, addition and removal of subsequent organic solvents. For instance, the nanocrystals may be precipitated out of solution and separated from the solvent by any means. At least a second solvent may be added back to the nanocrystals for further sonication. The removal and addition of organic solvents can aid in the removal of the contaminants released from the ligand and ionic exchanges. This step may help allow for more "space" in the reaction, via the second or subsequent solvent, which should be clean of previous impurities, to further aid in the ligand and ionic exchange, and also to aid in the separation of contaminates removed during the ligand and ionic exchanges. This may be referred to as a washing step and includes currently known methods as well as later developed methods to clean any impurities from the final material. Further, different organic solvents may be used in each washing step, for instance if certain solvents are better for removing different contaminants, each may be used in subsequent washing steps to remove certain impurities, such as specific ligands, specific atomic species, or even known impurities from solvents used. The sonication step and the washing step may also aid in the removal of the impurities from the surface of the nanocrystals.

In some embodiments, during the ionic exchange, for example, a calculated amount of Bi, Sb, Te, or other desirable ions may be added at a known ratio. The overall stoichiometry will be altered depending on the final desired material properties, and the calculated amount can be calculated based on the final ration desired using the molecular weight of the desired atomic species. In some embodiments a second ionic exchange may take place which can further alter the stoichiometry and reduce contaminate levels. The final material system may be $Bi_xSb_{(2-x)}Te_3$ nanocrystals with any ratio of dopants to give desired material properties. The size of the nanocrystals may be greater than 1 nm and less than 100 nm.

EXAMPLE

In one example method, intended to be illustrative but not limiting, bismuth sulfide and antimony telluride dissolved in hydrazine are mixed using a stir plate in a glovebox. Organic solvent is added as the mixture stirs. Afterwards, the mixture is sealed well to avoid exposure to oxygen, removed from the glovebox, and sonicated. The organic solvent is removed along with any soluble contaminates such as sulfur and long chain organic ligands. Additional organic solvent is added, allowed to stir, sonicated, and the organic solvent is removed. These steps can be iterated multiple times to help remove contaminates and allow "space" for the ligand exchange and ionic exchange. After the final organic solvent wash, the material is centrifuged, the supernatant is removed, and the remaining powder is washed using a series of inorganic solvents. After a series of inorganic solvents, antimony telluride dissolved in Te-hydrazine, referred to as "ink", is added to the solid along with organic solvent. The antimony telluride "ink" will provide ions for the ionic exchange and aid in the removal of any residual long chain organic ligands. Another series of organic solvent washing and sonication steps takes place. The material is then centrifuged and an additional series of inorganic solvents are used to wash the material. The material is finally dried and processed for further use.

In one embodiment, the nanocrystals isolated after washing may be dried. As can be seen from the above example, in some embodiments, a series of inorganic solvents may be used in similar washing steps to the above described organic solvent washing steps. In these embodiments, sonication, facilitation of ionic and/or ligand exchanges, and any of the other above described steps may be used in conjunction with the inorganic solvent washes. In a further embodiment, the isolated nanocrystals, whether dried or further washed with inorganic solvents, may be suspended in a solvent, either immediately after any washing, ionic exchange, and ligand exchange steps, or following drying of the isolated nanocrystals.

When suspending the nanocrystals, any now known or later developed solvents may be used. In some embodiments, the solvent may be a volatile solvent which may be inorganic. Any volatile solvent which is capable of leaving behind little or no organic residue when applied to a surface and possibly heated may be used. For example, the solvent may include Te-hydrazine, hydrazine, hydrazine hydrate, hydrazine sulfate, monomethylhydrazine, or any other solvent or combination of solvents that are volatile and don't leave much organic residue when evaporated by heating or drying.

The foregoing description of various aspects of the invention has been presented for the purpose of illustration and description. It is not intended to be exhaustive or to limit the invention to the precise form disclosed, and obviously, many modifications and variations are possible. Such variations and modifications that may be apparent to one skilled in the art are intended to be included within the scope of the present invention as defined by the accompanying claims.

The invention claimed is:

1. A method of exchanging an ion in a population of semiconductor nanocrystals, the method comprising:

mixing the population of semiconductor nanocrystals having a first material system with a set of particles in the presence of a first solvent, the set of particles having a second material system which is different from the first material system, to form a mixture;

facilitating an ionic exchange in the mixture, altering the first material system of the population of semiconductor nanocrystals to a third material system, different from the first material system and the second material system;

sonicating the mixture; and isolating the population of semiconductor nanocrystals having the third material system from the mixture.

2. The method of claim 1, further comprising:

washing the mixture to remove the first solvent; and adding a second solvent.

3. The method of claim 2, wherein the second solvent is the same as the first solvent.

4. The method of claim 2, wherein the second solvent is different from the first solvent.

5. The method of claim 1, further comprising:

drying the population of semiconductor nanocrystals having the third material system.

6. The method of claim 1, further comprising:

suspending the population of semiconductor nanocrystals having the third material system in a solvent.

7. The method of claim 6, wherein the solvent comprises hydrazine or hydrazine hydrate.

8. A method of exchanging a ligand in a population of semiconductor nanocrystals, the method comprising:

mixing the population of semiconductor nanocrystals having a first ligand with a set of particles in the presence of a first solvent, the set of particles having a second ligand which is different from the first ligand, to form a mixture;

facilitating a ligand exchange in the mixture;

sonicating the mixture; and isolating the population of semiconductor nanocrystals having the second ligand from the mixture.

9. The method of claim 8, further comprising:

washing the mixture to remove the first solvent; and adding a second solvent.

10. The method of claim 9, wherein the second solvent is the same as the first solvent.

11. The method of claim 9, wherein the second solvent is different from the first solvent.

12. The method of claim 8, further comprising:

drying the population of semiconductor nanocrystals having the second ligand.

13. The method of claim 8, further comprising:

suspending the population of semiconductor nanocrystals having the second ligand in a solvent.

14. The method of claim 13, wherein the solvent comprises hydrazine or hydrazine hydrate.

15. A method of purifying and doping a population of semiconductor nanocrystals, the method comprising:

mixing the population of semiconductor nanocrystals having a first material system and a first ligand with a set of particles in the presence of a first solvent, the set of particles having a second material system which is different from the first material system and a second ligand which is different from the first ligand, to form a mixture;

facilitating a ligand exchange and an ionic exchange in the mixture, altering the first material system of the population of semiconductor nanocrystals to a third material system, different from the first material system and the second material system;

sonicating the mixture; and isolating the population of semiconductor nanocrystals having the third material system and the second ligand from the mixture.

16. The method of claim 15, further comprising:

washing the mixture to remove the first solvent; and adding a second solvent.

17. The method of claim 16, wherein the second solvent is one of: the same as the first solvent or different from the first solvent.

18. The method of claim 15, further comprising:

drying the population of semiconductor nanocrystals having the third material system and the second ligand.

19. The method of claim 15, further comprising:

suspending the population of semiconductor nanocrystals having the third material system and second ligand in a solvent.

20. The method of claim 19, wherein the solvent comprises hydrazine or hydrazine hydrate.

* * * * *